US012805255B2

(12) United States Patent
Goel et al.

(10) Patent No.: US 12,805,255 B2
(45) Date of Patent: Nov. 17, 2026

(54) SUBSTRATE SUPPORT ASSEMBLY HAVING AN INTEGRATED SPRING PRESSURE PLATE

(71) Applicant: APPLIED MATERIALS, INC., Santa Clara, CA (US)

(72) Inventors: Ashish Goel, Cupertino, CA (US); Suresh Gupta, Union City, CA (US); Stephen Donald Prouty, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 131 days.

(21) Appl. No.: 18/760,824

(22) Filed: Jul. 1, 2024

(65) Prior Publication Data

US 2026/0005056 A1 Jan. 1, 2026

(51) Int. Cl.
*H10P 72/72* (2026.01)
*H01J 37/32* (2006.01)

(52) U.S. Cl.
CPC ...... *H10P 72/722* (2026.01); *H01J 37/32724* (2013.01)

(58) Field of Classification Search
CPC .......................... H10P 72/722; H01J 37/32724
See application file for complete search history.

(56) References Cited

U.S. PATENT DOCUMENTS

| | | | | |
|---|---|---|---|---|
| 11,527,429 | B2 * | 12/2022 | Parkhe | H10P 72/0432 |
| 12,266,557 | B2 * | 4/2025 | Kuno | H10P 72/722 |
| 2010/0020463 | A1 | 1/2010 | Nasman et al. | |
| 2016/0343600 | A1 * | 11/2016 | Parkhe | H10P 72/0432 |
| 2017/0256431 | A1 * | 9/2017 | Parkhe | H10P 72/0432 |
| 2018/0190528 | A1 | 7/2018 | Parkhe | |
| 2024/0071803 | A1 * | 2/2024 | Liu | H01J 37/32724 |

FOREIGN PATENT DOCUMENTS

| | | | |
|---|---|---|---|
| JP | 2010219354 | A | 9/2010 |
| KR | 19980072818 | A | 11/1998 |
| WO | 2020263690 | A1 | 12/2020 |

OTHER PUBLICATIONS

International Search Report and Written Opinion for International Application No. PCT/US2025/035789, mailed Nov. 4, 2025, 10 Pages.

* cited by examiner

*Primary Examiner* — Scott Bauer
(74) *Attorney, Agent, or Firm* — Lowenstein Sandler LLP

(57) ABSTRACT

A substrate support assembly includes a ceramic puck configured to support a substrate and a cooling plate in thermal communication with the ceramic puck. The substrate support assembly further includes a spring pressure plate disposed beneath the cooling plate. The spring pressure plate includes multiple spring elements configured to each apply an approximately equal force to the cooling plate. The substrate support assembly further includes a plurality of fasteners configured to removably couple the spring plate and the cooling plate to the ceramic puck.

20 Claims, 6 Drawing Sheets

SUBSTRATE SUPPORT ASSEMBLY HAVING AN INTEGRATED SPRING PRESSURE PLATE

TECHNICAL FIELD

Some embodiments of the present disclosure relate, in general, to a substrate support assembly (also referred to as an electrostatic chuck assembly) having an integrated spring pressure plate.

BACKGROUND

Electrostatic chucks are widely used to hold substrates, such as semiconductor wafers, during substrate processing in processing chambers used for various applications, such as physical vapor deposition, etching, or chemical vapor deposition. Electrostatic chucks typically include one or more electrodes embedded within a unitary chuck body which includes a dielectric or semi-conductive ceramic material across which an electrostatic clamping field can be generated.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to a chucking surface to allow a greater degree of control over substrate temperature.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

In one aspect of the present disclosure, a substrate support assembly includes a ceramic puck configured to support a substrate and a cooling plate in thermal communication with the ceramic puck. The substrate support assembly further includes a spring pressure plate disposed beneath the cooling plate. The spring pressure plate includes multiple spring elements configured to each apply an approximately equal force to the cooling plate. The substrate support assembly further includes a plurality of fasteners configured to removably couple the spring plate and the cooling plate to the ceramic puck.

In another aspect of the present disclosure, a spring pressure plate of a substrate support assembly includes a plate body, multiple spring elements disposed within pockets formed in the plate body, and multiple corresponding plungers. Each of the multiple corresponding plungers correspond to one of the multiple spring elements. The multiple spring elements are configured to apply, by the multiple corresponding plungers, an approximately equal force to a bottom side of a cooling plate of the substrate support assembly.

In a further aspect of the present disclosure, a method includes disposing one or more thermal interface layers between a cooling plate and a ceramic puck of a substrate support assembly. The method further includes mechanically coupling a spring pressure plate to the ceramic puck so that the cooling plate and the one or more thermal interface layers are disposed between the spring pressure plate and the ceramic puck. The method further includes removing one or more spring retaining elements from the spring pressure plate. One or more corresponding spring elements each apply an approximately equal force to the cooling plate responsive to the removing of the one or more spring retaining elements.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
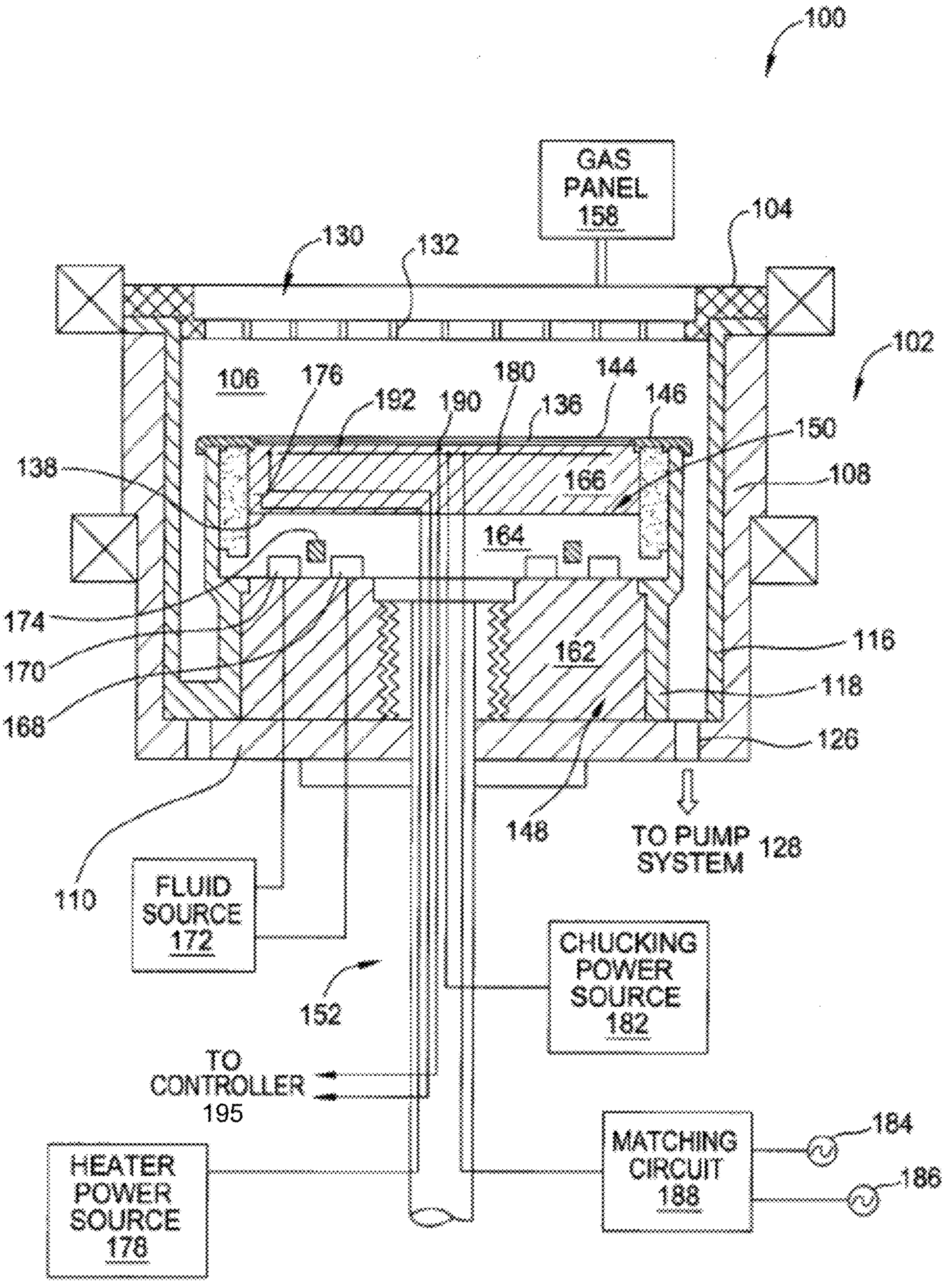
FIG. 1 depicts a sectional side view of a processing chamber, according to some embodiments.

Embodiments of the present disclosure provide a substrate support assembly (e.g., an electrostatic chuck assembly) having an integrated spring pressure plate.

In some embodiments, a substrate support assembly is assembled using multiple fasteners. In some substrate support assemblies, fasteners are used to secure a puck of the assembly directly to a cooling plate. The fasteners may all be tightened to an equal torque to ensure the fastening forces applied by each fastener is approximately equal. This facilitates approximately uniform pressure between the cooling plate and the puck, and therefore heat transfer properties between the puck and the cooling plate may also be approximately uniform. In some embodiments, springs are relied on to provide the force to create the pressure between the cooling plate and the puck. Springs may provide more uniform pressure between the cooling plate and the puck, leading to increased uniformity in heat transfer properties between the puck and the cooling plate.

In some embodiments, a substrate support assembly includes a stack of components. The stack may include a ceramic puck, a cooling plate, and one or more thermal interface layers between the ceramic puck and the cooling plate. In some substrate support assemblies, the cooling plate is directly coupled to the ceramic puck by mechanical fasteners as described above. However, direct coupling by mechanical fasteners may have shortcomings such as reduced uniformity in heat transfer characteristics between the ceramic puck and the cooling plate as described above and increased difficulty associated with replacement and/or refurbishment of one or more components of the substrate support assembly, such as the ceramic puck.

In some substrate support assemblies, the cooling plate is not mechanically coupled directly to the ceramic puck. Instead, springs push against the bottom of the cooling plate so that the top of the cooling plate exerts pressure against the bottom of the ceramic puck. Thermal interface layer(s) between the cooling plate and the ceramic puck facilitate heat transfer from the ceramic puck to the cooling plate. However, this arrangement may suffer from shortcomings related to serviceability. For example, to remove the substrate support assembly (e.g., such as for maintenance, etc.), each of the components may be individually removed, beginning with removal of the insulator plate, and finally with the removal of the ceramic puck. The thermal interface layer(s) may not be reusable, so new thermal interface layer(s) are used upon reassembly. Moreover, disassembly and reassembly of the substrate support assembly can lead to inconsistent thermal performance. For example, cooling plate, thermal interfaces and ceramic puck may be misaligned when reassembled, leading to nonuniform pressure and heat transfer between the cooling plate and the ceramic puck. In a further example, upon reassembly, the cooling plate, may exert an inconsistent and/or nonuniform pressure on the ceramic puck, leading to inconsistent and/or nonuniform transfer of heat.

In some embodiments described herein, a substrate support assembly is provided to improve thermal performance uniformity, to improve serviceability, and/or to improve manufacturability as compared to some substrate support assemblies. In some embodiments, a substrate support assembly can be uncoupled and/or removed from a baseplate without disassembling a stack of components that make up the substrate support assembly. For example, one or more thermal interface layers may be retained between a cooling plate and a ceramic puck when the ceramic puck is decoupled from a base plate. The cooling plate and/or the thermal interface layers may be "sandwiched" between a spring pressure plate and the ceramic puck so that when the assembly is removed (e.g., for maintenance, etc.), the interface(s) between each of the components are not disturbed.

In some embodiments, a substrate support assembly includes a ceramic puck configured to support a substrate. The ceramic puck may include one or more electrodes embedded within the ceramic puck that are to electrostatically secure the substrate to the ceramic puck when energized (e.g., with a voltage, etc.). In some embodiments, the substrate support assembly includes a cooling plate in thermal communication with the ceramic puck. The cooling plate may include multiple channels through which a coolant can flow to cool the ceramic puck. The thermal communication may be enabled by one or more thermal interface layers disposed between the ceramic puck and the cooling plate. In some embodiments, the substrate support assembly further includes a spring pressure plate disposed beneath the cooling plate.

In some embodiments, the spring pressure plate includes multiple spring elements. The multiple spring elements may be configured to each apply an approximately equal force to the bottom of the cooling plate. Via the spring elements, the spring pressure plate may be configured to cause the cooling plate to be pushed against the ceramic puck. For example, the force provided by the multiple spring elements may generate a pressure between the cooling plate and the ceramic puck. In some embodiments, the pressure between the cooling plate and the ceramic puck may be substantially uniform across a thermal interface between the cooling plate and the ceramic puck so that heat transfer characteristics between the cooling plate and the ceramic puck are substantially uniform. In some embodiments, the substrate support assembly further includes a plurality of fasteners configured to removably couple the spring plate and the cooling plate to the ceramic puck. In some embodiments, the plurality of fasteners engage features formed in the spring pressure plate and formed in the ceramic puck. The cooling plate may include holes to connect the features formed in the spring pressure plate to the features formed in the ceramic puck. In some embodiments, the cooling plate is "sandwiched" between the spring pressure plate and the ceramic puck when the fasteners are engaged with the features.

Embodiments of the present disclosure provide advantages over conventional solutions. For example, some embodiments described herein provide more uniform heat transfer between a cooling plate and a ceramic puck of a substrate support assembly when compared to conventional solutions. Increased uniformity in heat transfer characteristics may provide for increased uniformity in substrate processing, leading to more accurately produced substrates and/or increased yield. In another example, some embodiments, described herein provide increased serviceability of a substrate support assembly when compared to conventional solutions. Increased serviceability may come by way of ease of assembly and/or ease of disassembly of the substrate support assembly described herein. Specifically, a substrate support assembly described herein may be removed from a baseplate as a single unit stack without disassembly into individual component pieces (e.g., cooling plate, thermal interface layer(s), ceramic puck, etc.). By enabling removal of the substrate support assembly from the baseplate as a single unit stack, the thermal interface between the puck and the cooling plate may not be disturbed. Disturbance of the thermal interface may necessitate replacement of the interface. The substrate support assembly described herein may therefore be easier to disassemble (e.g., for maintenance, etc.) than other substrate support assemblies. Moreover, the substrate support assembly described herein may be assembled and disassembled more consistently than conventional substrate support assemblies such that heat transfer characteristics between the ceramic puck and the cooling plate may have increased uniformity. Again, increased uniformity in heat transfer characteristics may provide for increased uniformity in substrate processing, leading to more accurately produced substrates and/or increased yield.

FIG. 1 is a sectional view of one embodiment of a semiconductor processing chamber 100 having an electrostatic chuck assembly 150 disposed therein. The electrostatic chuck assembly 150 includes an electrostatic puck (puck 166) having an upper puck plate bonded to a lower puck plate, as will be discussed in greater detail below.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the sidewalls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

A substrate support assembly 148 is disposed in the interior volume 106 of the processing chamber 100 below the gas distribution assembly 130. The substrate support assembly 148 holds a substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In some embodiments, the substrate support assembly 148 includes a mounting plate 162 (e.g., a base plate) supporting a pedestal 152, and electrostatic chuck assembly 150. In one embodiment, the electrostatic chuck assembly 150 further includes a thermally conductive base referred to herein as a cooling plate 164 in thermal communication with an electrostatic puck (referred to hereinafter as a puck 166). One or more thermal interface layers (not shown) may be disposed between the puck 166 and the cooling plate 164 to enable the thermal communication between the puck 166 and the cooling plate 164. "Thermal communication" may refer to a physical arrangement of two or more components that provides the ability for heat to be transferred between the two or more components, especially by conduction such as between the puck 166 and the cooling plate 164. For example, two components that are in physical contact may be in thermal communication. In another example, two components that are in physical contact with a thermal interface between the two components may be in thermal communication. In some embodiments, a spring pressure plate (not shown) causes the cooling plate 164 to exert pressure against the bottom of the puck 166. More details regarding the spring pressure plate are described herein below. The electrostatic chuck assembly 150 described in embodiments may be used for Johnsen-Rahbek and/or Coulombic electrostatic chucking.

In some embodiments, a protective ring 146 is disposed over a portion of the puck 166 at an outer perimeter of the puck 166. In one embodiment, the puck 166 is coated with a protective layer 136. Alternatively, the puck 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$(silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_{2-x}Zr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The puck 166 includes an upper puck plate (not shown) and a lower puck plate (not shown) bonded by a metal bond in some embodiments. Alternatively, the puck 166 may include an upper puck plate, a lower puck plate, and a backing plate. Alternatively, the puck 166 may include a single ceramic plate (e.g., a monolithic ceramic plate). The upper puck plate may be a dielectric or electrically insulative material (e.g., having an electrical resistivity of greater than 1014 Ohm meter) that is usable for semiconductor processes at temperatures of 180° C. and above. In one embodiment, the upper puck plate is composed of materials usable from about 20° C. to about 500° C. In one embodiment, the upper puck plate is AlN. The AlN upper puck plate may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the upper puck plate is $Al_2O_3$. The $Al_2O_3$ upper puck plate may be undoped or may be doped. For example, the $Al_2O_3$ may be doped with Titanium dioxide ($TiO_2$) or a transition metal oxide.

The lower puck plate may have a coefficient of thermal expansion that is matched to a coefficient of thermal expansion of the upper puck plate. In one embodiment, the lower puck plate is a SiC porous body that is infiltrated with an AlSi alloy (referred to as AlSiSiC). The lower puck plate may alternatively be AlN or $Al_2O_3$. In one embodiment, the lower puck plate is undoped AlN or undoped $Al_2O_3$. In one embodiment, the lower puck plate is composed of the same material as the upper puck plate. The AlSiSiC material, AlN or $Al_2O_3$ may be used, for example, in reactive etch environments or in inert environments.

In one embodiment, the lower puck plate is Molybdenum. Molybdenum may be used, for example, if the puck 166 is to be used in an inert environment. Examples of inert environments include environments in which inert gases such as Ar, O2, N, etc. are flowed. Molybdenum may be used, for example, if the puck 166 is to chuck a substrate for metal deposition. Molybdenum may also be used for the lower puck plate for applications in a corrosive environment (e.g., etch applications). In such an embodiment, exposed surfaces of the lower puck plate may be coated with a plasma resistant coating after the lower puck plate is bonded to the upper puck plate. The plasma coating may be performed via a plasma spray process. The plasma resistant coating may cover, for example, side walls of the lower puck plate and an exposed horizontal step of the lower puck plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

If a backing plate is used (e.g., the puck 166 includes three plates), the backing plate may be formed of the same materials as the upper puck plate and/or the same materials as the lower puck plate.

The mounting plate 162 (e.g., the base plate) is coupled to the bottom 110 of the chamber body 102 and includes passages for routing utilities (e.g., fluids, power lines, sensor leads, etc.) to the cooling plate 164 and the puck 166. The cooling plate 164 and/or puck 166 may include one or more optional embedded heating elements 176, optional embedded thermal isolators 174 and/or optional conduits 168, 170 to control a lateral temperature profile of the substrate support assembly 148. In one embodiment, a thermal gasket 138 is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The conduits 168, 170 and embedded heating elements 176 may be utilized to control the temperature of the puck 166, heating and/or cooling the puck 166 and a substrate (e.g., a wafer) being processed. In one embodiment, the puck 166 includes two separate heating zones that can maintain distinct temperatures. In another embodiment, the puck 166 includes four different heating zones that can maintain distinct temperatures. The temperature of the electrostatic puck 166 and the cooling plate 164 may be monitored using multiple temperature sensors 190, 192, which may be monitored using a controller 195.

The puck 166 may further include multiple gas passages such as grooves, mesas and other surface features that may be formed in an upper surface of the puck 166. The gas passages may be fluidly coupled to a source of a heat transfer (or backside) gas, such as He via holes drilled in the puck 166. In operation, the backside gas may be provided at controlled pressure into the gas passages to enhance the heat transfer between the puck 166 and the substrate 144.

In one embodiment, the puck 166 includes at least one clamping electrode 180 controlled by a chucking power source 182. The clamping electrode 180 (also referred to as a chucking electrode) may further be coupled to one or more RF power sources 184, 186 through a matching circuit 188 for maintaining a plasma formed from process and/or other gases within the processing chamber 100. The one or more RF power sources 184, 186 are generally capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
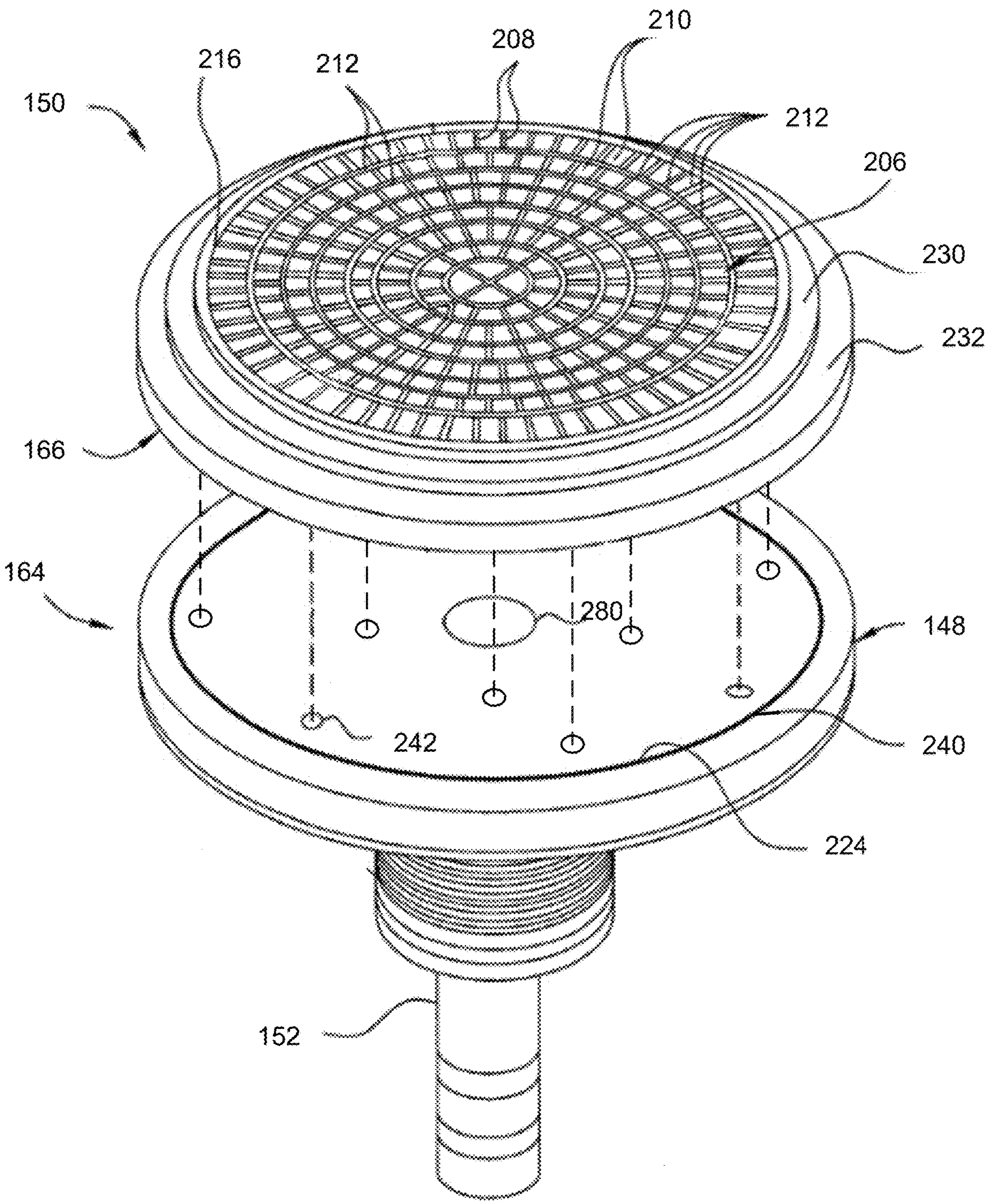
FIG. 2 depicts an exploded view of a substrate support assembly, according to some embodiments.

FIG. 2 depicts an exploded view of one embodiment of the substrate support assembly 148. The substrate support assembly 148 depicts an exploded view of the electrostatic chuck assembly 150 including the puck 166 and the pedestal 152. The electrostatic chuck assembly 150 includes the puck 166, as well as the cooling plate 164 attached to the puck 166. As shown, an o-ring 240 may be vulcanized to the cooling plate 164 along a perimeter of a top side of the cooling plate 164. Alternatively, the o-ring may be disposed on the top side of the cooling plate 164 without being vulcanized thereto. Embodiments are discussed herein with reference to o-rings and gaskets that are vulcanized to at least a portion of the cooling plate 164. However, it should be understood that the o-rings and/or gaskets may alternatively be vulcanized to the lower puck plate. Alternatively, the o-rings and/or gaskets may not be vulcanized to any surface. In one embodiment, the o-ring 240 is a perfluoropolymer (PFP) o-ring. Alternatively, other types of high temperature o-rings may be used. In one embodiment, thermally insulating high temperature o-rings are used. The o-ring 240 may be a stepped o-ring having a first step at a first thickness and a second step at a second thickness. This may facilitate uniform tightening of fasteners by causing the amount of force used to tighten the fasteners to increase dramatically after a set amount of compression of the o-ring 240.

Additional o-rings (not shown) may also be vulcanized to the top side of the cooling plate around a hole 280 at a center of the cooling plate 164 through which cables are run. Alternatively, a gasket (e.g., a PFP gasket) may be vulcanized to the top side of the cooling plate 164. Examples of PFPs usable for the gasket or o-ring 240 are Dupont's™ ECCtreme™, Dupont's KALREZ® and Daikin's® DUPRA™. The o-ring 240 or gasket provide a vacuum seal between a chamber interior volume and interior volumes within the electrostatic chuck assembly 150. The interior volumes within the electrostatic chuck assembly 150 include open spaces within the pedestal 152 for routing conduits and wiring.

The cooling plate 164 additionally includes numerous features 242 through which fasteners are inserted. The features 242 may be holes that connect features of a spring pressure plate to features of the puck 166. If a gasket is used, the gasket may have cutouts at each of the features 242. Fasteners extend through each of the features 242 and attach to additional portions of the fasteners (or additional fasteners) that are inserted into features formed in the puck 166. For example, a bolt may extend through a feature 242 in the cooling plate 164 and be screwed into a nut disposed in a feature of the puck 166. Each feature 242 in the cooling plate 164 may line up to a similar feature (not shown) in a lower puck plate 232 of puck 166.

The puck 166 has a disc-like shape having an annular periphery that may substantially match the shape and size of the substrate 144 positioned thereon. An upper surface of the puck 166 may have an outer ring 216, multiple mesas 206, 210 and channels 208, 212 between the mesas 210. The puck 166 includes an upper puck plate 230 bonded to the lower puck plate 232 by a metal bond. In one embodiment, the upper puck plate 230 may be fabricated by an electrically insulative ceramic material. Suitable examples of the ceramic materials include aluminum nitride (AlN), alumina ($Al_2O_3$), and the like.

In one embodiment, the material used for the lower puck plate 232 may be suitably chosen so that a coefficient of thermal expansion (CTE) for the lower puck plate 232 material substantially matches the CTE of the electrically insulative upper puck plate 230 material in order to minimize CTE mismatch and avoid thermo-mechanical stresses which may damage the puck 166 during thermal cycling. In one embodiment, the lower puck plate 232 is Molybdenum.

In one embodiment, the lower puck plate is alumina. In one embodiment, the lower puck plate is AlN.

In one embodiment, an electrically conductive metal matrix composite (MMC) material is used for the lower puck plate 232. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material for the lower puck plate 232 is preferably chosen to provide the desired electrical conductivity and to substantially match the CTE of the upper puck plate 230 material over the operating temperature range for the electrostatic chuck assembly 150. In one embodiment, the temperature may range from about 20° Celsius to about 500° Celsius. In one embodiment, matching the CTEs is based on selecting the MMC material so that the MMC material includes at least one material which is also used in the upper puck plate 230 material. In one embodiment, the upper puck plate 230 includes AlN. In one embodiment, the MMC material includes a SiC porous body that is infiltrated with an AlSi alloy.

The constituent materials and composition percentages of the MMC may be selected to provide an engineered material which meets desirable design objectives. For example, by suitably selecting the MCC material to closely match the CTEs of the lower puck plate 232 and upper puck plate 230, the thermo-mechanical stresses at an interface between the lower puck plate 232 and the upper puck plate 230 are reduced.

The lower puck plate 232 may include numerous features (not shown) for receiving fasteners. The features may be approximately evenly distributed across a surface of the lower puck plate 232 and may include a first set of features at a first distance from a center of the lower puck plate 232 and a second set of features at a second distance from the center of the lower puck plate 232.

The cooling plate 164 attached below the puck 166 may have a disc-like main portion 224 and an annular flange extending outwardly from the main portion 224 and positioned on the pedestal 152. In one embodiment, the cooling plate 164 may be fabricated by a metal, such as aluminum or stainless steel or other suitable materials. Alternatively, the cooling plate 164 may be fabricated by a composite ceramic, such as an aluminum-silicon alloy infiltrated SiC or Molybdenum to match a thermal expansion coefficient of the puck 166. The cooling plate 164 should provide good strength and durability as well as heat transfer properties.

Figure 3:
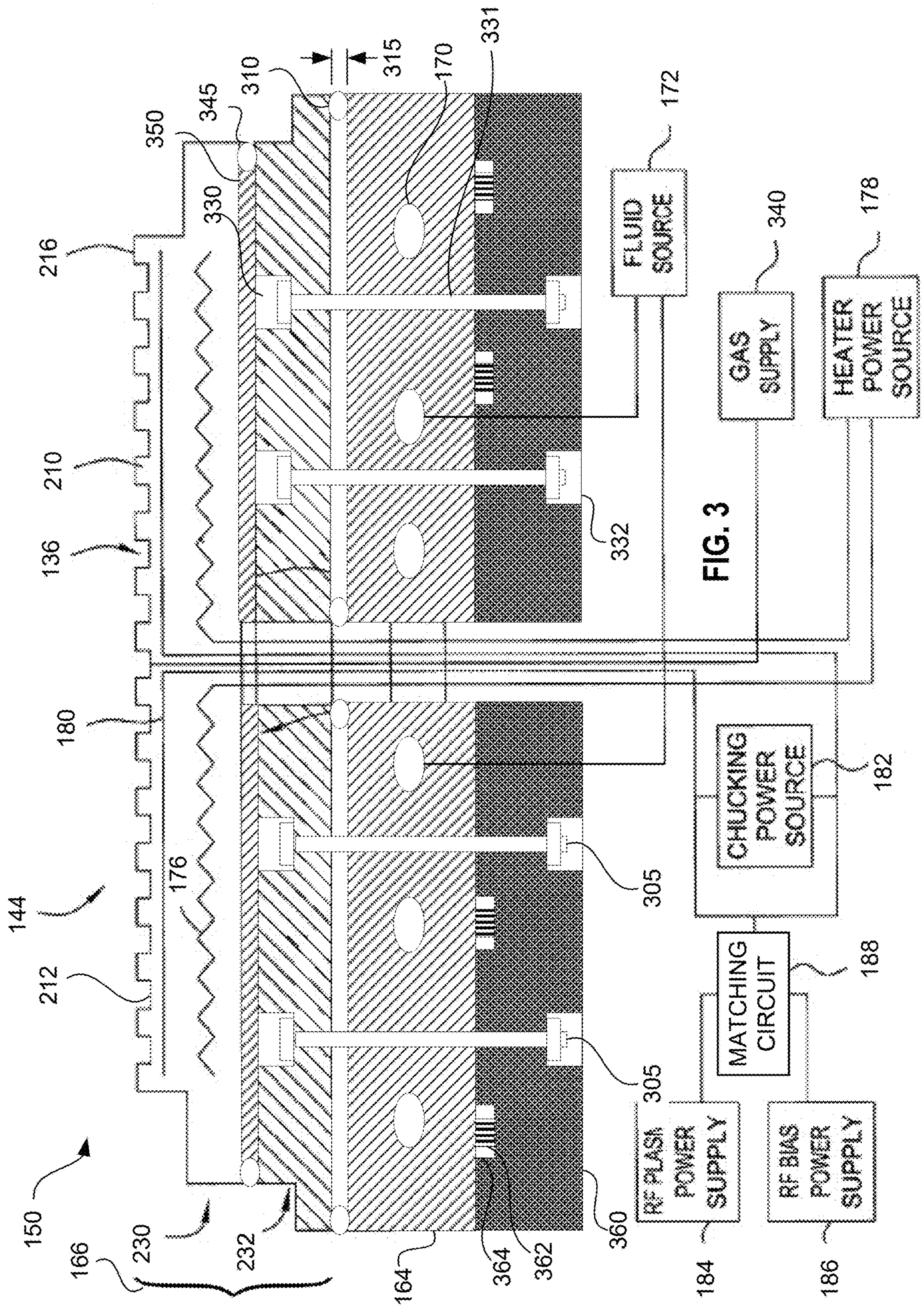
FIG. 3 depicts a sectional side view of an electrostatic chuck assembly, according to some embodiments.

FIG. 3 depicts a sectional side view of one embodiment of an electrostatic chuck assembly 150. The electrostatic chuck assembly 150 includes a puck 166 made up of an upper puck plate 230 and a lower puck plate 232 that are bonded together by a bond 350. In one embodiment, the bond 350 is a metal bond. In one embodiment, the bond 350 is a diffusion bond. In one embodiment, the upper puck plate 230 and the lower puck plate 232 comprise materials which include aluminum (e.g., AlN or $Al_2O_3$). Bond 350 may be a metal bond that includes an "interlayer" of aluminum foil which is placed in a bonding region between the upper puck plate 230 and the lower puck plate 232. Pressure and heat may be applied to form a diffusion bond between the aluminum foil and the upper puck plate 230 and between the aluminum foil and lower puck plate 232. In another embodiment, the diffusion bond may be formed using other interlayer materials which are selected based upon the materials used for upper puck plate 230 and lower puck plate 232. In another embodiment, the upper puck plate 230 may be directly bonded to the lower puck plate 232 using direct diffusion bonding in which no interlayer is used to form the bond.

A plasma resistant and high temperature o-ring 345 may be made of a perfluoropolymer (PFP), polyimide, and/or other materials. In one embodiment, the o-ring 345 may be a PFP with inorganic additives such as SiC. The o-ring may be replaceable. When the o-ring 345 degrades it may be removed and a new o-ring may be stretched over the upper puck plate 230 and placed at a perimeter of the puck 166 at an interface between the upper puck plate 230 and the lower puck plate 232. The o-ring 345 may protect the metal bond 350 from erosion by plasma.

The upper puck plate 230 includes mesas 210, channels 212 and an outer ring 216. The upper puck plate 230 includes clamping electrodes 180 and one or more heating elements 176. The clamping electrodes 180 are coupled to a chucking power source 182, and to a RF plasma power supply 184 and an RF bias power supply 186 via a matching circuit 188. The upper puck plate 230 and lower puck plate 232 may additionally include gas delivery holes (not shown) through which a gas supply 340 pumps a backside gas such as He.

The upper puck plate 230 may have a thickness of about 3-25 mm. In one embodiment, the upper puck plate 230 has a thickness of about 3 mm. The clamping electrodes 180 may be located about 1 mm from an upper surface of the upper puck plate 230, and the heating elements 176 may be located about 1 mm under the clamping electrodes 180. The heating elements 176 may be screen printed heating elements having a thickness of about 10-200 microns. Alternatively, the heating elements may be resistive coils that use about 1-3 mm of thickness of the upper puck plate 230. In such an embodiment, the upper puck plate 230 may have a minimum thickness of about 5 mm. In one embodiment, the lower puck plate 232 has a thickness of about 8-25 mm.

The heating elements 176 are electrically connected to a heater power source 178 for heating the upper puck plate 230. The upper puck plate 230 may include electrically insulative materials such as AlN. The lower puck plate 232 and upper puck plate 232 may be made of the same materials. In one embodiment, the lower puck plate 232 is made of materials which are different from the materials used for the upper puck plate 230. In one embodiment, the lower puck plate 232 is composed of a metal matrix composite material. In one aspect, the metal matrix composite material includes aluminum and silicon. In one embodiment, the metal matrix composite is a SiC porous body infiltrated with an AlSi alloy.

In some embodiments, the lower puck plate 232 is in thermal communication with a cooling plate 164 having one or more conduits 170 (also referred to herein as cooling channels) in fluid communication with fluid source 172. Heat may be transferred from the lower puck plate 232 through one or more thermal interface layers (not shown) to the cooling plate 164. The heat may then be transferred to the fluid flowing through the one or more conduits 170. In some embodiments, a spring pressure plate 360 may be fastened to the puck 166 via one or more fasteners (e.g., one or more threaded fasteners). In some embodiments, spring pressure plate 360 may provide a spring force to press the cooling plate 164 against the lower puck plate 232 and to distribute a force between the puck 166 and the cooling plate 164 across an interface between the puck 166 and the cooling plate 164. In some embodiments, the spring pressure plate 360 includes multiple spring elements 362. Each of the spring elements 362 may be disposed within a pocket 364. The spring elements 362 may each apply an approximately equal force against the bottom of the cooling plate 164. The force provided by the spring elements 362 may cause the top of the cooling plate 164 to push against the bottom of the lower puck plate 232. Equally distributed pressure between the cooling plate 164 and the lower puck plate 232 may allow for heat to be uniformly transferred from the lower puck plate 232 to the cooling plate 164 (e.g., optionally via the one or more thermal interface layers).

In some embodiments, the spring elements 362 are coil springs, leaf springs, or other spring devices such as bevel washers, etc. In some embodiments, the spring elements 362 are constructed of spring steel. In some embodiments, the spring pressure plate 360 is formed of aluminum and/or an aluminum alloy.

In some embodiments, the spring pressure plate 360 is coupled to the puck 166 by multiple fasteners 305. The fasteners 305 may be threaded fasteners such as nut and bolt pairs. As shown, the lower puck plate 232 includes multiple features 330 for accommodating the fasteners 305. The spring pressure plate 360 likewise includes multiple features 332 for accommodating the fasteners 305. In one embodiment, the features are or include bolt holes with counter bores. As shown, the features 330 are through features that extend through the lower puck plate 232. Alternatively, the features 330 may not be through features. In one embodiment, the features 330 are slots that accommodate a t-shaped bolt head or rectangular nut that may be inserted into the slot and then rotated 90 degrees. In some embodiments, the cooling plate 164 includes features 331 that connect the features 330 with the features 332 and through which the fasteners 305 can extend. For example, the features 331 are holes that connect the features 330 with the feature 332. Fasteners 305 can extend through the holes so that the spring pressure plate 360 can be mechanically coupled with the lower puck plate 232. In one embodiment, the fasteners include washers, grafoil, aluminum foil, or other load spreading materials to distribute forces from a head of the fastener evenly over a feature.

In one embodiment (as shown), an o-ring 310 is vulcanized to (or otherwise disposed on) the cooling plate at a perimeter of the cooling plate 164. Alternatively, the o-ring 310 may be vulcanized to the bottom side of the lower puck plate 232. Spring force from the spring pressure plate 360 (e.g., spring force provided by the spring elements 362) may be provided to compress the o-ring 310. The spring elements 362 may each provide an approximately equal force to cause a separation 315 between the puck 166 and the cooling plate 164 to be approximately the same (uniform) throughout the interface between the puck 166 and the cooling plate 164. This may ensure that the heat transfer properties between the cooling plate 164 and the puck 166 are uniform. In one embodiment, the separation 315 is about 2-10 mils. The separation may be 2-10 mils, for example, if the o-ring 310 is used without a grafoil layer. If a grafoil layer is used along with the o-ring 310, then the separation may be about 10-40 mils. Larger separation may decrease heat transfer, and cause the interface between the puck 166 and the cooling plate 164 to act as a thermal choke. In one embodiment, a conductive gas may be flowed into the separation 315 to improve heat transfer between the puck 166 and the cooling plate 164. In some embodiments, cooling plate 164 contacts puck 166 without use of an o-ring as a spacer. In some embodiments, one or more interface layers (e.g., such as grafoil, a gasket, etc.) are disposed between the cooling plate and the puck 166 to facilitate thermal communication therebetween.

The separation 315 minimizes the contact area between the puck 166 and the cooling plate 164. In some instances, the separation is zero or approximately zero. Additionally, in some embodiments, by maintaining a thermal choke between the puck 166 and the cooling plate 164, the puck 166 may be maintained at much greater temperatures than the cooling plate 164. For example, in some embodiments the puck 166 may be heated to temperatures of 180-300 degrees Celsius, while the cooling plate 164 may maintain a temperature of below about 120 degrees Celsius. The puck 166 and the cooling plate 164 are free to expand or contract independently during thermal cycling.

The separation 315 may function as a thermal choke by restricting the heat conduction path from the heated puck 166 to the cooled cooling plate 164. In a vacuum environment, heat transfer may be primarily a radiative process unless a conduction medium is provided. Since the puck 166 may be disposed in a vacuum environment during substrate processing, heat generated by heating elements 176 may be transferred more inefficiently across the separation 315. Therefore, by adjusting the separation and/or other factors that affect heat transfer, the heat flux flowing from the puck 166 to the cooling plate 164 may be controlled. To provide efficient heating of the substrate, it is desirable to limit the amount of heat conducted away from the upper puck plate 230.

In one embodiment (not shown), a grafoil layer is disposed between the puck 166 and the cooling plate 164 within a perimeter of the o-ring 310. The grafoil may have a thickness of about 10-40 mil. The fasteners 305 may be tightened to compress the grafoil layer as well as the o-ring 310. The grafoil may be thermally conductive, and may improve a heat transfer between the puck 166 and the cooling plate 164.

In one embodiment (not shown), the cooling plate 164 includes a base portion to which the o-ring 310 may be vulcanized. The cooling plate 164 may additionally include a spring loaded inner heat sink connected to the base portion by one or more springs. The springs apply a force to press the inner heat sink against the puck 166. A surface of the heat sink may have a predetermined roughness and/or surface features (e.g., mesas) that control heat transfer properties between the puck 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

Figure 4:
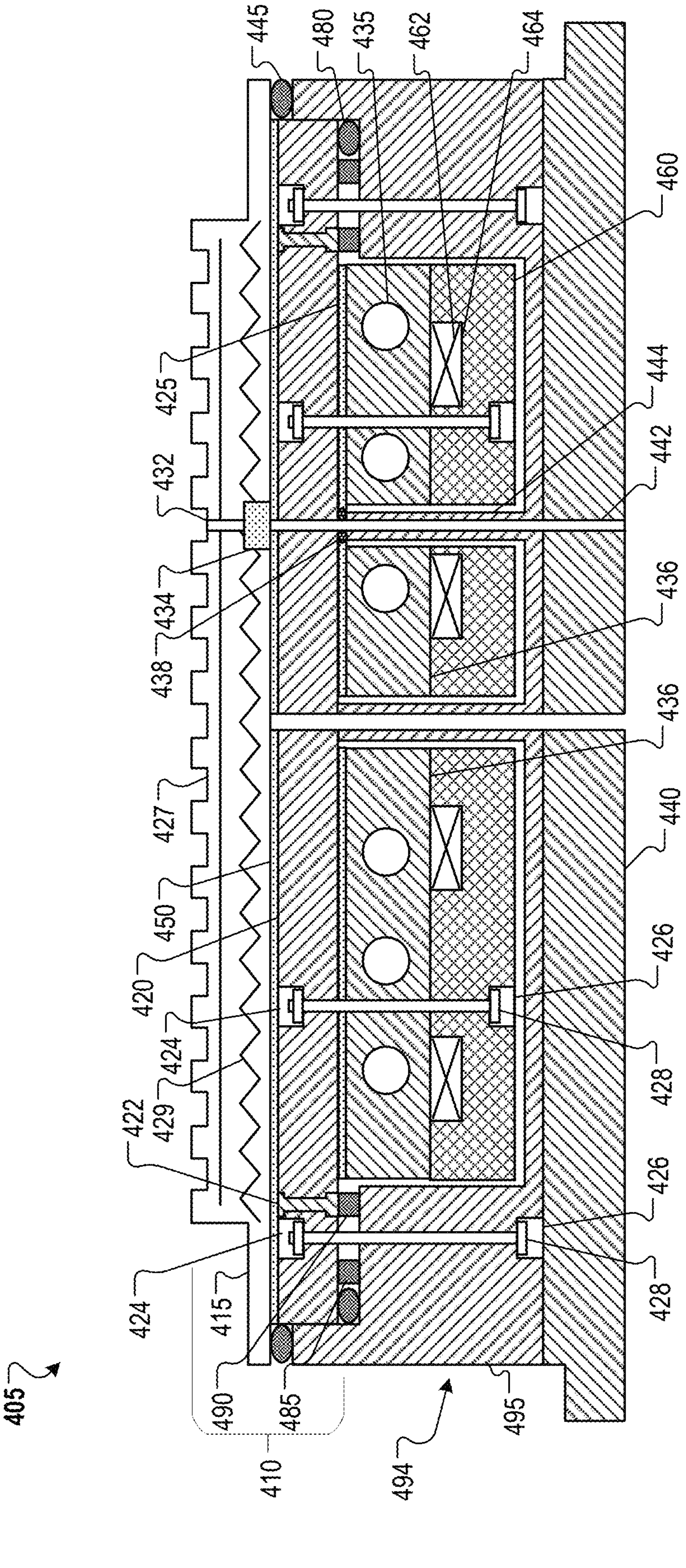
FIG. 4 depicts a sectional side view of an electrostatic chuck assembly, according to some embodiments.

FIG. 4 depicts a sectional side view of another embodiment of an electrostatic chuck assembly 405. In some embodiments, electrostatic chuck assembly 405 corresponds to electrostatic chuck assembly 150 of FIGS. 1-2. The electrostatic chuck assembly 405 includes an electrostatic puck 410 made up of an upper puck plate 415 and a lower puck plate 420. In some embodiments, the electrostatic puck 410 includes an upper puck plate, a lower puck plate, and a backing plate. Alternatively, the electrostatic puck 410 may include a single ceramic plate (e.g., a monolithic ceramic plate). In some embodiments, electrostatic puck 410 corresponds to puck 166 of FIG. 3. In one embodiment, the upper puck plate 415 is bonded to the lower puck plate 420 by a bond 450. In one embodiment, the bond 450 is a metal bond. In one embodiment, the bond 450 is a diffusion bond.

The upper puck plate 415 may be composed of an electrically insulative (dielectric) ceramic such as AlN or $Al_2O_3$. The upper puck plate 415 includes clamping electrodes 427 and one or more heating elements 429. The clamping electrodes 427 may be coupled to a chucking power source (not shown), and to an RF plasma power supply (not shown) and an RF bias power supply (not shown) via a matching circuit (not shown). The heating elements 429 are electrically connected to a heater power source (not shown) for heating the upper puck plate 415.

The upper puck plate 415 may have a thickness of about 3-10 mm. In one embodiment, the upper puck plate 415 has a thickness of about 3-5 mm. The clamping electrodes 427 may be located about 0.3 to 1 mm from an upper surface of the upper puck plate 415, and the heating elements 429 may be located about 2 mm under the clamping electrodes 427. The heating elements 429 may be screen printed heating elements having a thickness of about 10-200 microns. Alternatively, the heating elements 429 may be resistive coils that use about 1-3 mm of thickness of the upper puck plate 415. In such an embodiment, the upper puck plate 415 may have a minimum thickness of about 5 mm.

The lower puck plate 420 is composed of a material that has a similar or matching coefficient of thermal expansion (CTE) to the upper puck plate 415. The material used for the lower puck plate 420 may be suitably chosen so that the CTE for the lower puck plate 420 material substantially matches the CTE of the electrically insulative upper puck plate 415 material in order to minimize CTE mismatch and avoid thermo-mechanical stresses which may damage the electrostatic chuck assembly 405 during thermal cycling. Accordingly, if the upper puck plate 415 is AlN, then the lower puck plate 420 may also be AlN. Similarly, if the upper puck plate is $Al_2O_3$, then the lower puck plate 420 may also be $Al_2O_3$. Other materials may also be used for the lower puck plate 420 such as Molybdenum or an electrically conductive metal matrix composite (MMC) such as AlSiSiC.

In one embodiment, the lower puck plate 420 has a thickness of approximately 8-25 mm. In a further embodiment, the lower puck plate 420 has a thickness that is approximately 8-20 mm. In a further embodiment, the lower puck plate 420 has a thickness of about 12 mm.

In one embodiment, the lower puck plate 420 has a roughened outer wall that has been coated with a plasma resistant ceramic coating (not shown). The plasma resistant ceramic coating may correspond to any of the plasma resistant ceramic coatings discussed with reference to protective layer 136.

The bond 450 may include an "interlayer" of aluminum foil that is placed in a bonding region between the upper puck plate 415 and the lower puck plate 420. Pressure and heat may be applied to form a diffusion bond between the aluminum foil and the upper puck plate 415 and between the aluminum foil and lower puck plate 420. In other embodiments, the diffusion bonds may be formed using other interlayer materials which are selected based upon the materials used for upper puck plate 415 and the lower puck plate 420. In one embodiment, the metal bond 450 has a thickness of about 0.2-0.3 mm. In one embodiment, the upper puck plate 415 may be directly bonded to the lower puck plate 420 using direct diffusion bonding in which no interlayer is used to form the bond.

The upper puck plate 415 may have a diameter that is larger than a diameter of the lower puck plate 420. In one embodiment, the upper puck plate 415 and the lower puck plate 420 each has a diameter of about 300 mm.

An edge of a cooling plate 494 may have a similar diameter to the diameter of the upper puck plate 415. A plasma resistant and high temperature o-ring 445 may be disposed between upper puck plate 415 and a base portion 495 of the cooling plate 494. This o-ring 445 may provide a vacuum seal between an interior of the electrostatic chuck assembly 405 and a processing chamber. The o-ring 445 may be made of a perfluoropolymer (PFP), polyimide, and/or other materials. In one embodiment, the o-ring 445 is a PFP with inorganic additives such as SiC. The o-ring 445 may be replaceable. When the o-ring 445 degrades it may be removed and a new o-ring may be stretched over the upper puck plate 415 and placed at a perimeter of the upper puck plate 415 at an interface between the upper puck plate 415 and the cooling plate 494. The o-ring 445 may protect the metal bond 450 from erosion by plasma.

The cooling plate 494 includes base portion (also referred to as a cooling base) 495 and a heat sink (e.g., an inner heat sink) 436. In some embodiments, the heat sink 436 is "sandwiched" between a spring pressure plate 460 and the electrostatic puck 410. The spring pressure plate 460 may include multiple spring elements 462 (e.g., springs, etc.) that apply force to the heat sink 436 against the electrostatic puck 410. The spring elements 462 may be disposed within spring pockets 464 formed in the top surface of the spring pressure plate 460. In some embodiments, each of the spring elements 462 push against a corresponding plunger element (not shown). Each of the corresponding plunger elements may push against the heat sink 436. The spring elements 462 via the corresponding plunger elements may distribute a force between the electrostatic puck 410 and the heat sink 436 across an interface between the electrostatic puck 410 and the heat sink 436. The force may be equally distributed across the interface so that heat may be uniformly transferred between the electrostatic puck 410 and the heat sink 436. In some embodiments, during installation of the spring pressure plate 460, each of the spring elements 462 are retained by a corresponding retaining element as described herein below. In some embodiments, the spring pressure plate 460 may be fastened to the electrostatic puck 410 via one or more fasteners (e.g., one or more threaded fasteners).

The heat sink 436 may have one or more conduits 435 (also referred to herein as cooling channels) in fluid communication with a fluid source (not shown). A surface of the heat sink 436 may have a predetermined roughness and/or surface features (e.g., mesas) that affect heat transfer properties between the electrostatic puck 410 and the heat sink 436. Additionally, the material of the heat sink 436 may affect the heat transfer properties. For example, an aluminum heat sink 436 will transfer heat better than a stainless steel heat sink 436. In one embodiment, a mounting plate 440 is disposed beneath and coupled to the cooling plate 494.

The lower puck plate 420 may include numerous features 424 configured to receive fasteners 426. The spring pressure plate 460 may likewise include multiple features 428 configured to receive the fasteners 426. Alternatively, or additionally, the mounting plate 440 may include multiple features configured to receive fasteners. Features 428 may line up vertically with features 424. In one embodiment, the features 424, 428 are bolt holes with counter bores. In one embodiment, the features 424, 428 are slots that accommodate a t-shaped bolt head or rectangular nut that may be inserted into the slot and then rotated 90 degrees. In some embodiments, the heat sink 436 includes holes to connect the features 424 with the features 428 so that fasteners 426 may extend through the heat sink 436.

In one embodiment, the cooling plate 494 is coupled to the electrostatic puck 410 by multiple fasteners 426 that are inserted into the features 428, 424. The fasteners 426 may be stainless steel, galvanized steel, molybdenum, or other metal. The fasteners 426 may be threaded fasteners such as nut and bolt pairs. In one embodiment, the fasteners 426 include washers, grafoil, aluminum foil, or other load spreading materials to distribute forces from a head of the fastener evenly over a feature. In one embodiment, a helical insert (e.g., a Heli-Coil®) or other threaded insert (e.g., a press fit insert, a mold-in insert, a captive nut, etc.) may be inserted into features 424 to add a threaded hole thereto. A bolt placed inside of the cooling plate 494 (e.g., inside features 424 in the base portion 495 of the cooling plate 494) and protruding from the cooling plate 494 may then be threaded into the threaded insert to secure the cooling plate to the puck. Alternatively, threaded inserts may be used in the cooling plate.

In one embodiment, a captive nut, mold insert, press fit insert, or other threaded insert is positioned inside of features 424. In a further embodiment, at least a portion of the threaded inserts is brazed prior to insertion into the features 424. Alternatively, a metal foil may be placed between the threaded insert and a surface of the feature 424. A metal bonding (e.g., diffusion bonding) procedure may then be performed to secure the threaded insert to the feature 424. This may provide increased durability for application of increased force during assembly.

The heat sink 436 and/or base portion 495 of the cooling plate 494 may absorb heat from the electrostatic puck 410. One or more thermal interface layers forming a thermal interface stack may be disposed between the heat sink 436 and the electrostatic puck 410. In one embodiment (as shown), a low thermal conductivity gasket 425 is disposed on the heat sink 436. The low thermal conductivity gasket 425 may be, for example, a PFP gasket that is vulcanized to (or otherwise disposed on) the heat sink 436. In one embodiment, the low thermal conductivity gasket has a thermal conductivity of about 0.2 Watts per meter Kelvin (W/(m·K)) or lower. The fasteners 426 may be tightened with approximately the same force, and the springs 470 may press the heat sink 436 against the lower puck plate 420 to evenly compress the low thermal conductivity gasket 425. The low thermal conductivity gasket 425 may decrease heat transfer and act as a thermal choke.

In one embodiment, a grafoil layer (not shown) is disposed over the low thermal conductivity gasket 425. The grafoil may have a thickness of about 10-40 mil. The fasteners 426 and/or spring elements 462 may compress the grafoil layer as well as the low thermal conductivity gasket 425. The grafoil may be thermally conductive and may improve a lateral heat transfer across the heat sink 436. Together, the low thermal conductivity gasket 425 and the grafoil layer may form a thermal interface stack.

By maintaining a thermal choke between the electrostatic puck 410 and the cooling plate 494, the electrostatic puck 410 may be maintained at much greater temperatures than the cooling plate 494. For example, in some embodiments the electrostatic puck 410 may be heated to temperatures of 200-300 degrees Celsius, while the cooling plate 494 may maintain a temperature of below about 120 degrees Celsius. In one embodiment, the electrostatic puck 410 may be heated up to a temperature of about 250° C. while maintaining the cooling plate 494 at a temperature of about 60° C. or below. Accordingly, up to a 190° C. delta may be maintained between the electrostatic puck 410 and the cooling plate 494 in embodiments. The electrostatic puck 410 and the cooling plate 494 are free to expand or contract independently during thermal cycling.

In some embodiments it may be desirable to provide an RF signal through the electrostatic puck 410 and to a supported substrate during processing. In one embodiment, to facilitate the transmission of such an RF signal through the electrostatic puck 410, an electrically conductive gasket referred to as an RF gasket 490 is disposed on the base portion 495 of the cooling plate 494. The RF gasket may have a conductivity on the order of $10^{-3}$ Ohm·meter or better and may retain a spring action at temperatures of up to about 300 degrees C. In one embodiment, the RF gasket is Inconel (an alloy of nickel containing chromium and iron) coated in gold, copper or silver. The RF gasket 490 may electrically connect the base portion 495 of the cooling plate 494 to the lower puck plate 420.

In embodiments in which the lower puck plate 420 has a low electrical conductivity (e.g., if the lower puck plate 420 is AlN or $Al_2O_3$), a hole may be drilled in the lower puck plate 420 where the lower puck plate 420 will contact the RF gasket. The hole may then be filled with a high conductivity material such as a metal (e.g., a metal rod having a conductivity on the order of $10^{-3}$ Ohm·meter or better). For example, the hole may be filled with aluminum, tungsten, copper, nickel, molybdenum, silver, gold, etc. Accordingly, an electrically conductive path 422 may be formed in the lower puck plate 420 to electrically connect the RF signal to the metal bond 450. In one embodiment, an electrically conductive pad is formed at the surfaces of the lower puck plate 420 around the electrically conductive path 422. This may ensure good electrical contact to the metal bond 450 and the RF gasket 490. In one embodiment, a shallow recess is bored into the lower puck plate 420 centered on the hole formed for the electrically conductive path 422. The shallow recess may also be filled with a metal or other conductive material. In the illustrated example, the RF gasket 490 and electrically conductive path 422 are on an outside of the heat sink 436 (e.g., at a further distance from a center of the electrostatic chuck assembly 405 than the heat sink 436). Alternatively, the RF gasket 490 and electrically conductive path 422 may be formed near a center of the electrostatic chuck assembly 405.

In one embodiment, an electrically conductive path between the metal bond 450 and the RF gasket 490 is formed by coating an outer wall of the lower puck plate 420 with a metal layer. The metal layer may be aluminum, copper, gold, silver, an alloy thereof, or another metal. A top and bottom of the lower puck plate 420 may also be coated with the metal layer near the outer wall to ensure a good electrical contact. In such an embodiment, the RF gasket 490 may be positioned near the outer wall of the lower puck plate 420.

In another embodiment, an electrically conductive path between the metal bond 450 and the RF gasket 490 is formed by coating the walls of a center hole in the lower puck plate 420 with a metal layer. The metal layer may be aluminum, copper, gold, silver, an alloy thereof, or another metal. A top and bottom of the lower puck plate 420 may also be coated with the metal layer near the outer wall to ensure a good electrical contact. In such an embodiment, the RF gasket 490 may be positioned near the center of the lower puck plate 420.

In one embodiment, a thermal spacer 485 is disposed on the base portion 495 of the cooling plate 494 (e.g., adjacent to the RF gasket 490). The thermal spacer 485 may be used to ensure that the base portion 495 of the cooling plate 494 will not come into contact with the lower puck plate 420. In one embodiment, an o-ring 480 is disposed adjacent to the thermal spacer 485. The o-ring 480 may be a PFP o-ring in one embodiment. The o-ring 480 may be used to facilitate a vacuum seal.

In one embodiment, one or more gas holes 432, 442 are drilled into the cooling plate 494, the lower puck plate 420 and the upper puck plate 415. The gas holes 432, 442 may be used to deliver a backside gas such as helium to a backside of a chucked substrate. In one embodiment, the upper puck plate 415 includes a gas hole 432 that terminates at a porous plug 434. The gas hole 432 may be a through hole that is counter bored with a larger diameter bore to permit the porous plug 434 to be inserted into the larger diameter bore. The porous plug 434 may be a porous ceramic such as AlN or $Al_2O_3$. The porous plug 434 may prevent arcing and/or may prevent a plasma from being generated within the electrostatic puck 405. The porous plug may have a porosity of anywhere between about 30% to about 60%.

In one embodiment, the heat sink 436 includes a hole, and the base portion 495 of the cooling plate 494 includes a projection 444 that extends through the hole in the heat sink 436. The hole 442 may be bored into the projection 444 (e.g., into a center of the projection 444). In one embodiment, an o-ring 438 is disposed on a top of the projection 444. The fasteners 426 may compress the o-ring 438 when tightened. The o-ring 438 may be a same type of o-ring as o-ring 445 and/or o-ring 480.

Figure 5A:
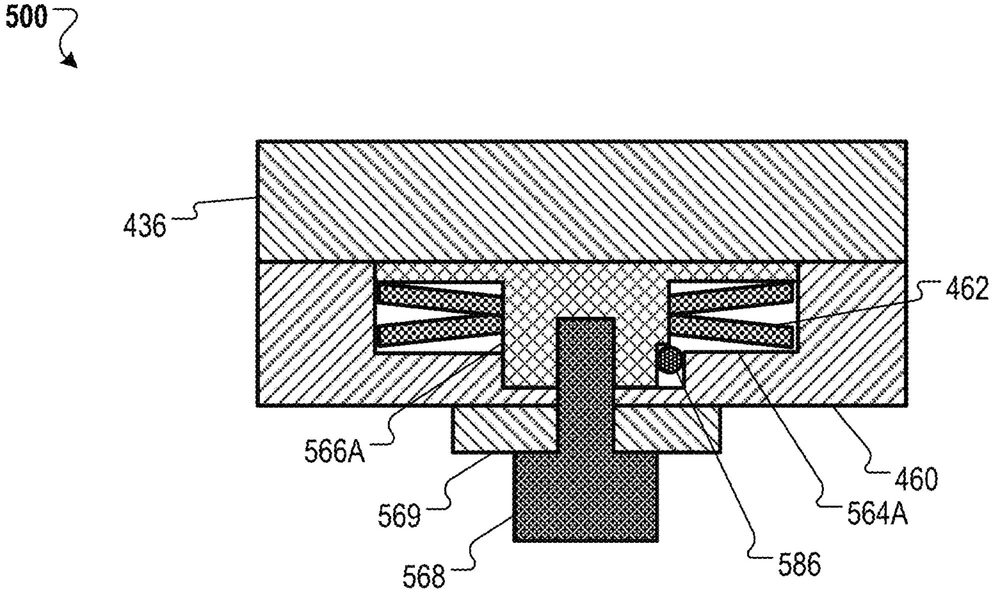
FIGS. 5A-B depict a spring element and plunger assembly of a spring pressure plate, according to some embodiments.
Figure 5B:
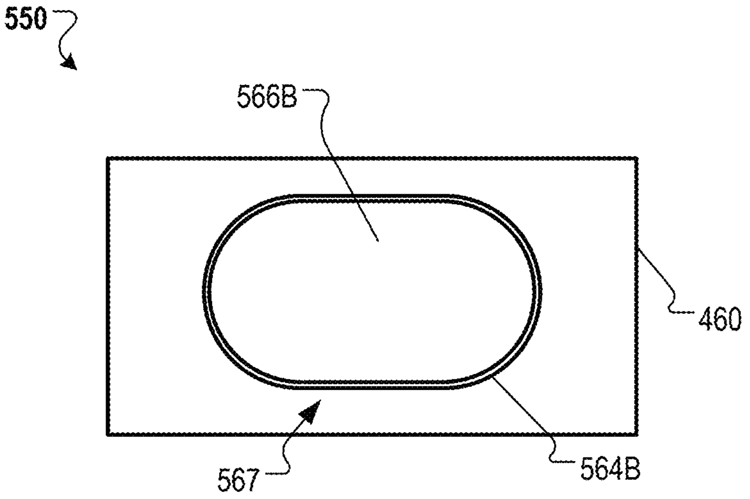

FIGS. 5A-B depict a spring element and plunger assembly of a spring pressure plate, according to some embodiments. Referring to FIG. 5A, a section side view of assembly 500 is shown. In some embodiments, a spring element 462 (e.g., a spring, one or more springs, etc.) is disposed within a spring pocket 564A formed in the top surface of a spring pressure plate 460. The spring pocket 564A may correspond to spring pocket 464 described herein above. A plunger 566A may further be disposed within the pocket 564A. In some embodiments, the spring element 462 exerts a spring force on the plunger 566A. The plunger 566A may push against the bottom of a heat sink 436 (e.g., a cooling plate, etc.). In some embodiments, the spring element 462 is a coil spring, a leaf spring, or another type of spring. In some embodiments, the spring element 462 is one or more bevel washers. For example, the spring element 462 may include a first bevel washer disposed above a second bevel washer. The second bevel washer may be inverted with respect to the first bevel washer. The spring element 462 may exert the spring force on a flange of the plunger 566A.

In some embodiments, the spring element 462 has a spring constant between approximately 0.5 kilo-Newton per millimeter (kN/mm) and approximately 2 kN/mm. In some embodiments, the spring element 462 has a spring constant between approximately 0.75 kilo-Newton per millimeter (kN/mm) and approximately 1.5 kN/mm. In some embodiments, the spring element 462 has a maximum displacement between approximately 0.5 mm and approximately 1.0 mm. In some embodiments, the spring element 462 can provide approximately 1,000 Newtons of spring force against the bottom of the heat sink 436 (e.g., via the plunger 566A). In some embodiments, the spring pressure plate 460 includes multiple spring elements 462 disposed in multiple spring pockets 564A. For example, and in some embodiments, the spring pressure plate 460 may include between 10 and 20 spring elements 462. In some embodiments, the spring pressure plate 460 include between 12 and 18 spring elements 462. In some embodiments, the spring pressure plate 460 includes approximately 16 spring elements 462. The multiple spring elements 462 may be distributed approximately uniformly across the spring pressure plate 460.

In some embodiments, the plunger 566A is retained by a retaining element such as retaining screw 568. The retaining screw 568 may be a threaded fastener that engages with a feature formed in the plunger 566A (e.g., a threaded feature, etc.). A washer 569 may be disposed between a head of the retaining screw 568 and the bottom surface of the spring pressure plate 460 to prevent damage to the spring pressure plate 460 and/or to provide locking capabilities. For example, the washer 569 may be a lock washer, etc. In some embodiments, when installing the spring pressure plate 460 and/or the heat sink 436, the retaining screw 568 is positioned to engage with the plunger 566A. Engagement of the retaining screw 568 with the plunger 566A may compress the spring element 462 so that no spring force is applied to the bottom of the heat sink 436. For example, the retaining screw 568 may be screwed into the plunger 566A, drawing the plunger 566A downwards so that the plunger 566A does not push against the heat sink 436, compressing the spring element 462. After the spring pressure plate 460 is installed (e.g., coupled to electrostatic puck 410 by fasteners 426 as described herein above with respect to FIG. 4), the retaining screw 568 may be removed so that the plunger 566A can apply the spring force to the bottom of the heat sink 436. Without the retaining screw 568, when assembling the spring pressure plate 460 and the heat sink 436, the spring elements 462 may apply unequal spring forces to the bottom of the heat sink 436 which may lead to nonuniform heat transfer characteristics between the heat sink 436 and the spring plate 460.

To stop the plunger 566A from rotating (such as when installing or uninstalling the retaining screw 568 etc.), assembly 500 may include an anti-rotation feature. In some embodiments, an anti-rotation ball 586 is included in the spring pocket 564A. The anti-rotation ball 586 may engage a feature formed on the plunger 566A and a feature formed in the spring pocket 564A. When a torque (e.g., a twisting force, etc.) is applied to the plunger 566A, the anti-rotation ball 586 may engage the features to stop the plunger 566A from rotating. Referring to FIG. 5B, an embodiment 550 of the anti-rotation feature is shown. In some embodiments, a plunger 566B includes a flat 567 on an outer periphery that engages with a corresponding flat formed in a spring pocket 564B formed in the spring pressure plate 460. The two flats may engage to stop the plunger 566B from rotating (e.g., when a twisting force is applied to the plunger 566B).

Figure 6:
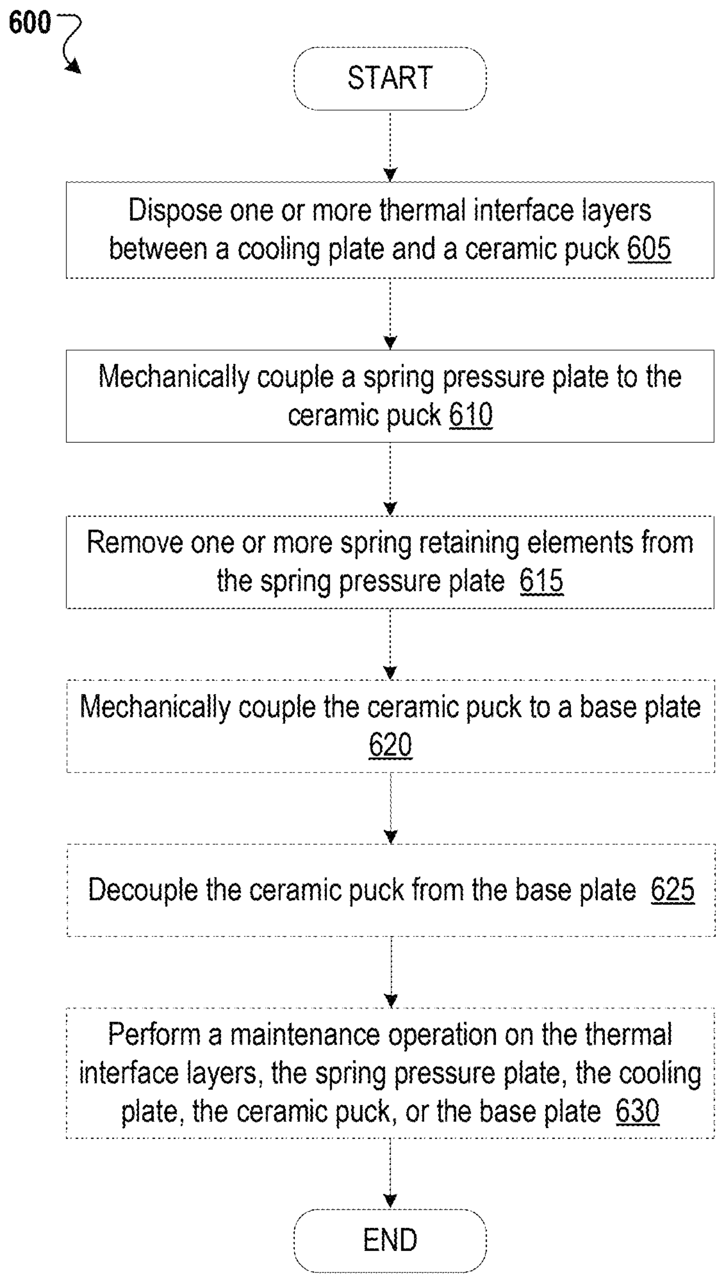
FIG. 6 illustrates a flow diagram of a method related to a substrate support assembly, according to some embodiments.

FIG. 6 illustrates a flow diagram of a method 600 related to a substrate support assembly, according to some embodiments. Method 600 may include the assembly of a substrate support assembly and/or the disassembly of a substrate support assembly (e.g., such as for maintenance, etc.).

For simplicity of explanation, method 600 is depicted and described as a series of operations. However, operations in accordance with this disclosure can occur in various orders and/or concurrently and with other operations not presented and described herein. Furthermore, not all illustrated operations may be performed to implement method 600 in accordance with the disclosed subject matter.

At block 605, one or more thermal interface layers are disposed between a cooling plate and a ceramic puck. The one or more thermal interface layers may for a thermal interface stack. The one or more thermal interface layers may include a low thermal conductivity gasket and/or one or more grafoil layers, etc. In some embodiments, the thermal interface stack enables thermal communication between the ceramic puck and the cooling plate. For example, the thermal interface stack may allow heat to flow from the ceramic puck to the cooling plate and vice versa, etc.

At block 610, a spring pressure plate is mechanically coupled to the ceramic puck. The cooling plate may be "sandwiched" between the spring pressure plate and the ceramic puck, and may also be mechanically coupled to the ceramic puck and to the spring pressure plate. In some embodiments, a plurality of fasteners are used to couple the spring pressure plate to the ceramic puck. The plurality of fasteners may be inserted into features formed in the spring pressure plate and may engage with corresponding features formed in the ceramic puck. In some embodiments, the fasteners are inserted through holes formed in the cooling plate. The holes may connect the features formed in the spring pressure plate with the features formed in the ceramic puck. In some embodiments, the spring pressure plate is removably coupled to the ceramic puck so that the cooling plate and the one or more thermal interface layers are "sandwiched" between the spring pressure plate and the ceramic puck.

At block 615, one or more spring retaining elements (e.g., retaining screws, etc.) are removed from the spring pressure plate. When (and before) the spring pressure plate is coupled to the ceramic puck, the one or more spring retaining elements may retain spring elements in the spring pressure plate from applying a spring force on the cooling plate. Removal of the one or more spring retaining elements may allow the spring elements to apply spring force to the cooling plate so that a pressure is exerted between the cooling plate and the ceramic puck. Pressure between the cooling plate and the ceramic puck may allow heat to be transferred from the ceramic puck to the cooling plate and vice versa, etc. Responsive to removing the spring retaining elements, the spring elements may apply an approximately equal force to the cooling plate.

At block 620, the ceramic puck is mechanically coupled to a base plate (e.g., of the substrate support assembly). In some embodiments, multiple fasteners are used to secure the ceramic puck to the base plate. The ceramic puck and the base plate may each form features that accept fasteners. The fasteners may be inserted into the features so that the ceramic puck is removably coupled with the base plate. In some embodiments, coupling the ceramic puck to the base plate also couples the spring pressure plate, the cooling plate, and the thermal interface layer(s) to the base plate because the spring pressure plate, the cooling plate, and the thermal interface layer(s) are coupled with the ceramic puck.

Eventually it may be beneficial to remove the ceramic puck and/or other components of the substrate support assembly from a chamber, such as for maintenance. Accordingly, at block 625, the ceramic puck (and cooling plate and spring plate) may be decoupled from the base plate. During and after the decoupling, the one or more thermal interface layers are retained between the cooling plate and the ceramic puck because the spring pressure plate remains mechanically coupled to the ceramic puck. The cooling plate and/or the thermal interface layer(s) may remain "sandwiched" between the spring pressure plate and the ceramic puck. The thermal interface layer(s) may not be disturbed during this operation. Disturbance of the thermal interface layer(s) may lead to damage to the layers which may ultimately necessitate replacement of the layer(s).

At block 630, a maintenance operation may be performed on the thermal interface layers, the spring pressure plate, the cooling plate, the ceramic puck, and/or the base plate. The maintenance operation may include servicing and/or replacing one or more components. For example, one or more components can be reconditioned and/or one or more broken or faulty components repaired or replaced. After the maintenance operation is complete, the ceramic puck (e.g., and the spring pressure plate, the cooling plate, and/or the thermal interface layer(s), etc. as a single assembly) may be recoupled to the base plate.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single operation.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate support assembly, comprising:

a base portion forming a recess;

a ceramic puck configured to support a substrate, wherein the ceramic puck is to couple to the base portion;

a cooling plate in thermal communication with the ceramic puck and disposed at least partially within the recess;

a spring pressure plate disposed beneath the cooling plate within the recess formed in the base portion, the spring pressure plate comprising multiple spring elements configured to each apply an approximately equal force to the cooling plate; and a plurality of fasteners configured to removably couple the spring pressure plate and the cooling plate to the ceramic puck.

2. The substrate support assembly of claim 1, wherein the spring pressure plate comprises a first plurality of features configured to receive a first end of the plurality of fasteners, wherein the ceramic puck comprises a second plurality of features configured to receive a second end of the plurality of fasteners, and wherein the cooling plate comprises a plurality of holes to connect the first plurality of features to the second plurality of features.

3. The substrate support assembly of claim 1, further comprising:

a thermal interface stack disposed between the cooling plate and the ceramic puck, wherein the thermal interface stack is configured to enable the thermal communication between the ceramic puck and the cooling plate.

4. The substrate support assembly of claim 1, wherein the spring pressure plate further comprises a corresponding retaining element for each of the multiple spring elements.

5. The substrate support assembly of claim 1, wherein the spring pressure plate further comprises a corresponding plunger element for each of the multiple spring elements, wherein each of the corresponding plunger elements provide the approximately equal force to the cooling plate.

6. The substrate support assembly of claim 1, wherein each of the multiple spring elements comprise one or more bevel washers.

7. The substrate support assembly of claim 1, wherein each of the multiple spring elements has a spring constant between approximately 0.5 kilo-Newton per millimeter (kN/mm) and approximately 2 kN/mm.

8. The substrate support assembly of claim 1, wherein the ceramic puck comprises an upper puck plate and a lower puck plate bonded to the upper puck plate by a metal bond or a diffusion bond.

9. The substrate support assembly of claim 8, wherein the upper puck plate comprises $Al_2O_3$ or AlN and the lower puck plate comprises $Al_2O_3$ or AlN.

10. The substrate support assembly of claim 1, wherein the cooling plate is comprised of aluminum and the spring pressure plate is comprised of a metal.

11. The substrate support assembly of claim 1, wherein the spring pressure plate is configured to cause the cooling plate to be pushed against the ceramic puck with a substantially uniform pressure.

12. The substrate support assembly of claim 1, wherein the ceramic puck comprises one or more electrodes configured to electrostatically secure the substrate to the ceramic puck.

13. A spring pressure plate of a substrate support assembly, the spring pressure plate comprising:

a plate body;

multiple spring elements disposed within pockets formed in the plate body; and multiple corresponding plungers, each of the multiple corresponding plungers corresponding to one of the multiple spring elements, wherein the multiple spring elements are configured to apply, by the multiple corresponding plungers, an approximately equal force to a bottom side of a cooling plate of the substrate support assembly.

14. The spring pressure plate of claim 13, further comprising:

a plurality of features configured to receive a first end of a plurality of fasteners, and wherein the spring pressure plate is configured to removably couple to a puck of the substrate support assembly by the plurality of fasteners.

15. The spring pressure plate of claim 13, further comprising a corresponding retaining element for each of the multiple spring elements, and wherein each of the multiple spring elements comprise one or more bevel washers.

16. The spring pressure plate of claim 13, wherein each of the multiple spring elements has a spring constant between approximately 0.5 kilo-Newton per millimeter (kN/mm) and approximately 2 kN/mm.

17. The spring pressure plate of claim 13, wherein the plate body comprises a metal.

18. A method, comprising:

disposing one or more thermal interface layers between a cooling plate and a ceramic puck of a substrate support assembly;

mechanically coupling a spring pressure plate to the ceramic puck so that the cooling plate and the one or more thermal interface layers are disposed between the spring pressure plate and the ceramic puck; and removing one or more spring retaining elements from the spring pressure plate, wherein one or more corresponding spring elements each apply an approximately equal force to the cooling plate responsive to the removing of the one or more spring retaining elements.

19. The method of claim 18, further comprising:

mechanically coupling the ceramic puck to a base plate of the substrate support assembly.

20. The method of claim 19, further comprising:

decoupling the ceramic puck from the base plate, wherein the one or more thermal interface layers are retained between the cooling plate and the ceramic puck during the decoupling; and performing a maintenance operation on at least one of the one or more thermal interface layers, the spring pressure plate, the cooling plate, the ceramic puck, or the base plate.

* * * * *